United States Patent
Weber et al.

(10) Patent No.: US 6,366,494 B2
(45) Date of Patent: Apr. 2, 2002

(54) MAGNETORESISTIVE MEMORY HAVING ELEVATED INTERFERENCE IMMUNITY

(75) Inventors: Werner Weber, München; Roland Thewes, Gröbenzell, both of (DE); Gunther Plasa, Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/821,964

(22) Filed: Mar. 30, 2001

Related U.S. Application Data

(63) Continuation of application No. PCT/DE99/03135, filed on Sep. 29, 1999.

(30) Foreign Application Priority Data

Sep. 30, 1998 (DE) .......................................... 198 45 069

(51) Int. Cl.⁷ ................................................ G11C 11/15
(52) U.S. Cl. ...................................... 365/158; 365/173
(58) Field of Search ............................... 365/158, 171, 365/173, 157

(56) References Cited

U.S. PATENT DOCUMENTS

| | | | |
|---|---|---|---|
| 4,547,866 A | 10/1985 | Lutes et al. ................. | 365/173 |
| 5,375,082 A | 12/1994 | Katti et al. .................... | 365/45 |
| 5,640,343 A | 6/1997 | Gallagher et al. .......... | 365/171 |
| 5,699,293 A | 12/1997 | Tehrani et al. .............. | 365/158 |
| 5,838,608 A * | 11/1998 | Zhu et al. .................... | 365/158 |
| 5,920,500 A | 7/1999 | Tehrani et al. .............. | 365/173 |
| 5,940,319 A * | 8/1999 | Durlam et al. .............. | 365/158 |
| 5,946,227 A * | 8/1999 | Naji ........................... | 365/158 |
| 6,285,581 B1 * | 9/2001 | Tehrani et al. .............. | 365/158 |

FOREIGN PATENT DOCUMENTS

| | | |
|---|---|---|
| DE | 197 44 095 A1 | 4/1999 |
| EP | 0 773 551 A2 | 5/1997 |
| JP | 09 073 773 | 3/1997 |
| WO | WO 95/10112 | 4/1995 |

* cited by examiner

Primary Examiner—Tan T. Nguyen
(74) Attorney, Agent, or Firm—Herbert L. Lerner; Laurence A. Greenberg; Werner H. Stemer

(57) ABSTRACT

The magnetoresistive memory provides for an improvement in interference immunity even though only a small chip area is used. Word lines are situated vertically between two complementary bit lines, a magnetoresistive memory system of a regular location is situated between a bit line and a word line, and an appertaining magnetoresistive layer system of a complementary memory location is situated between the complementary bit line and the word line in the vertical direction.

3 Claims, 1 Drawing Sheet

MAGNETORESISTIVE MEMORY HAVING ELEVATED INTERFERENCE IMMUNITY

CROSS-REFERENCE TO RELATED APPLICATION

This is a continuation of copending International Application PCT/DE99/03135, filed Sept. 29, 1999, which designated the United States.

BACKGROUND OF THE INVENTION

Field of the Invention

The present invention relates to a magnetoresistive write-read memory (MRAM) whose storage effect consists in the magnetically controlled electrical resistance of the memory is locations.

International PCT publication WO 95/10112 and U.S. Pat. No. 5,699,293 teach a non-volatile write/read memory in which a non-magnetic non-conductive layer is present between two ferromagnetic layers, with one layer having a fixed orientation and the other layer having a magnetic orientation that is defined by the operation. The resistance across the two ferromagnetic layers varies with the orientation of the respective magnetic moments.

SUMMARY OF THE INVENTION

It is accordingly an object of the invention to provide a magnetoresistive read/write memory, which overcomes the above-mentioned disadvantages of the heretofore-known devices and methods of this general type and which makes it possible to increase the interference immunity given an optimally small chip surface area.

With the foregoing and other objects in view there is provided, in accordance with the invention, a magnetoresistive memory, comprising a vertically stacked assembly of a layer for a first bit line, a magnetoresistive layer system of a first memory location, a layer for word lines, a magnetoresistive layer system of a second memory location, and a layer for an second bit line vertically stacked on top of one another, wherein logic states to be stored in the first memory location and the second memory location are inverses of one another.

In accordance with an added feature of the invention, the second memory location in a described state always comprises an inverse state of a state of the first location beneath it, and wherein a current in the bit line flows in a direction opposite to a direction of a current in the second bit line situated above it.

In accordance with a concomitant feature of the invention, each magnetoresistive layer system comprises a magnetically soft layer, a magnetically hard layer, and a thin tunnel oxide separating the two magnetic layers from one another.

Other features which are considered as characteristic for the invention are set forth in the appended claims.

Although the invention is illustrated and described herein as embodied in a magnetoresistive memory having elevated interference immunity, it is nevertheless not intended to be limited to the details shown, since various modifications and structural changes may be made therein without departing from the spirit of the invention and within the scope and range of is equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention may be summarized in that a local reference memory location for each individual memory location is provided and a common word line is disposed between these two memory locations vertically. This makes possible a very compact and effective interference compensation.

Figure 1:
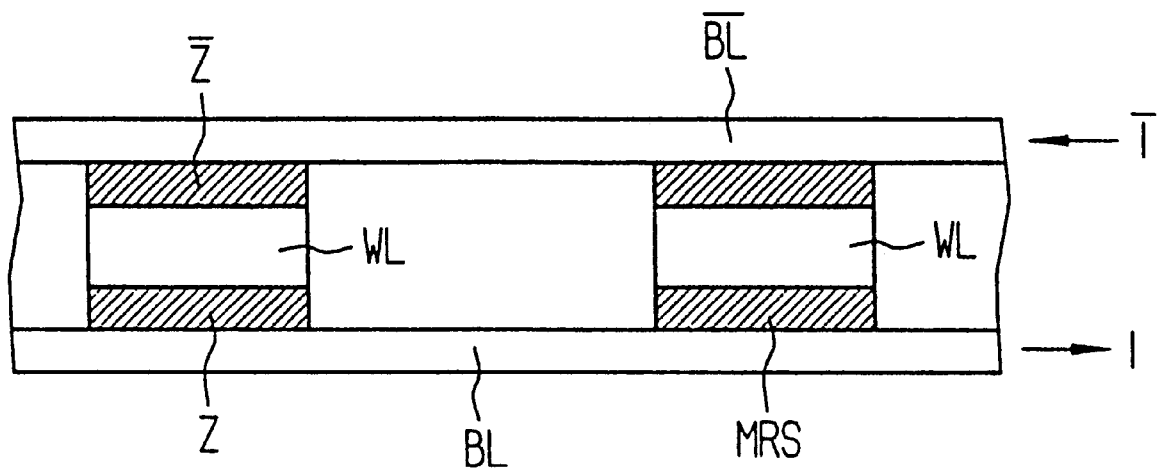
FIG. 1 is a sectional view of an MRAM according to the invention.

Referring now to the figures of the drawing in detail and first, particularly, to FIG. 1 thereof, there is shown a part of a magnetoresistive memory having two word lines WL and two bit lines BL, $\overline{BL}$. Between the bit line BL and the word lines 13 WL, magnetoresistive layer systems MRS are respectively situated. In the same way, such magnetoresistive layer systems are also situated between the word lines WL and the additional bit line $\overline{BL}$. Consequently, it is possible to achieve a total memory location area of only $4F^2$, with F being the smallest resolvable structural width. The layer systems between the bit line BL and the word line WL form regular memory locations Z, and the layer systems between the word lines WL and the additional bit line $\overline{BL}$ form complementary memory locations $\overline{Z}$. The states stored in the complementary memory locations $\overline{Z}$ are the inverse of those stored in the respective underlying memory locations Z; i.e., inverse states are written in by way of the bit lines BL and $\overline{BL}$, respectively. The bit line $\overline{BL}$ carries the inverse signal of the signal on the bit line BL, whereby a current $\overline{I}$ flowing in the bit line $\overline{BL}$ flows in the opposite direction to the direction of a current in the bit line BL. Since the resistances of the magnetoresistive layer systems differ only on the order of approx. 10% in dependence upon their stored status, the influence of interference must be accounted for. Since the signals on the bit lines BL and $\overline{BL}$ are the inverse of one another, it is possible to achieve an amplification of the payload signal and an attenuation of the noise quantities that act equally on the two complementary locations, and thus to increase the interference immunity, by difference formation.

Figure 2:
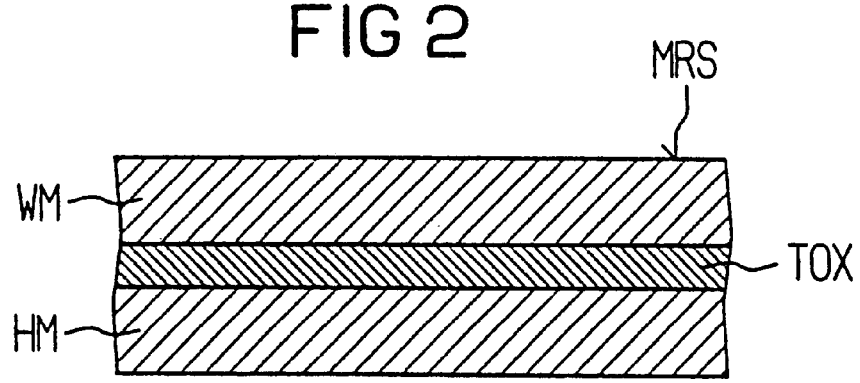
FIG. 2 is a sectional view of a magnetoresistive layer system that is present in FIG. 1.

FIG. 2 shows the magnetoresistive layer system MRS of the locations Z and $\overline{Z}$ of FIG. 1. The layer system MRS essentially consists of a magnetically soft layer WM and a magnetically hard layer HM, which are separated by a tunnel oxide TOX. The ferromagnetic layers typically consist of a material containing at least one substance from a list that includes iron, nickel, and cobalt, with the material of the layer HM having a higher coercive field strength than the material of the layer WM. The tunnel oxide TOX consists of alumina $Al_2O_3$, for example. Instead of the tunnel oxide TOX, other thin insulator layers such as silicon nitride or the like can also be used.

The magnetoresistive layer system can vary the magnetization direction of the magnetically soft layer WM of a location Z for a long period of time, and can thereby store logical states of zero or one, with sufficient currents in a selected bit line BL and a selected word line WL. The reading of the location Z is then accomplished in that a current flows from the appertaining word line to the appertaining bit line through the location, the intensity of which depends on the magnetization direction of the magnetically soft layer WM. The current intensity differs when the magnetization directions in the layers WM and HM are parallel from when they are antiparallel, because the tunneling probability is different in each case.

We claim:

1. A magnetoresistive memory, comprising a vertically stacked assembly of a layer for a first bit line, a magnetoresistive layer system of a first memory location, a layer for word lines, a magnetoresistive layer system of a second memory location, and a layer for an second bit line vertically stacked on top of one another, wherein logic states to be stored in said first memory location and said second memory location are inverses of one another.

2. The magnetoresistive memory according to claim 1, wherein said second memory location in a described state always comprises an inverse state of a state of said first location therebeneath, and wherein a current in said bit line flows in a direction opposite to a direction of a current in said second bit line situated thereabove.

3. The magnetoresistive memory according to claim 1, wherein each said magnetoresistive layer system comprises a magnetically soft layer, a magnetically hard layer, and a thin tunnel oxide separating said magnetically soft layer from said magnetically hard layer.

* * * * *